US006741087B2

(12) United States Patent

Kimura et al.

(10) Patent No.: US 6,741,087 B2

(45) Date of Patent: May 25, 2004

(54) VOLTAGE-APPLYING PROBE, APPARATUS FOR MANUFACTURING ELECTRON SOURCE USING THE PROBE, AND METHOD FOR MANUFACTURING ELECTRON SOURCE USING THE APPARATUS

(75) Inventors: Akihiro Kimura, Kanagawa (JP); Kazuhiro Oki, Chiba (JP); Shigeto Kamata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 10/143,783

(22) Filed: May 14, 2002

(65) Prior Publication Data

US 2002/0177382 A1 Nov. 28, 2002

(30) Foreign Application Priority Data

May 22, 2001 (JP) ....................................... 2001-152873

(51) Int. Cl.$^{7}$ ............................................... G01R 31/02

(52) U.S. Cl. .......................... 324/754; 324/761; 29/874

(58) Field of Search ................................. 324/754, 760, 324/158.1, 761–762; 29/592.1, 593, 825, 846, 868, 874, 885

(56) References Cited

U.S. PATENT DOCUMENTS

| | | | |
|---|---|---|---|
| 5,622,634 A | 4/1997 | Noma et al. | 216/40 |
| 5,873,659 A | 2/1999 | Edwards et al. | |
| 6,344,711 B1 | 2/2002 | Ohnishi et al. | 313/495 |
| 6,384,541 B1 | 5/2002 | Ohnishi et al. | 315/169.3 |

FOREIGN PATENT DOCUMENTS

| | | | |
|---|---|---|---|
| JP | 60-259970 | * 12/1985 | G01R/1/06 |
| JP | 7-235255 | 9/1995 | |
| JP | 07-262954 | * 10/1995 | G01N/1/28 |
| JP | 08152816 | 6/1996 | |
| JP | 8-171849 | 7/1996 | |
| JP | 200013741 B | 5/2000 | |
| JP | 2001117990 | 4/2001 | |

* cited by examiner

*Primary Examiner*—Kamand Cuneo
*Assistant Examiner*—Paresh Patel
(74) *Attorney, Agent, or Firm*—Fitzpatrick, Cella, Harper & Scinto

(57) ABSTRACT

A probe for applying a voltage to lines provided on a substrate comprises (a) a conductive sheet, the conductive sheet including a mesh sheet in which linear members are woven into a mesh and a conductive material which coats the mesh sheet, (b) an elastic member for pressing the conductive sheet against the lines, and (c) a holding member for holding the conductive sheet and the elastic member together. The probe has improved electrical connectivity and durability, and achieves a reduction in size and facilitation of operations of an apparatus for manufacturing an electron source.

12 Claims, 10 Drawing Sheets

VOLTAGE-APPLYING PROBE, APPARATUS FOR MANUFACTURING ELECTRON SOURCE USING THE PROBE, AND METHOD FOR MANUFACTURING ELECTRON SOURCE USING THE APPARATUS

BACKGROUND OF THE INVENTION

1. Field of the Invention

The present invention relates to a probe used for applying a voltage, and to an apparatus for manufacturing an electron source, the apparatus including the probe.

2. Description of the Related Art

Electron-emitting devices included in electron sources are generally classified as being one of two types: thermionic cathode and cold cathode. Examples of cold cathode include field-emission type electron-emitting devices, metal/insulating layer/metal type electron-emitting devices, and surface-conduction type electron-emitting devices.

The operation of a surface-conduction type electron-emitting device is based on a phenomenon wherein electron emission occurs when a current is passed through a thin, small film formed on a substrate, in parallel with the film surface. The basic structure and manufacturing methods of surface-conduction type electron-emitting devices are disclosed in, for example, Japanese Patent Laid-Open Nos. 7-235255 and 8-171849.

A typical surface-conduction type electron-emitting device includes a pair of device electrodes opposed to each other on a substrate, and a conductive film which is connected to the pair of device electrodes and which is provided with a fissure (gap). The fissure (gap) is formed in a part of the conductive film.

A film containing at least one of carbon and a carbon compound as a principal constituent is disposed in the fissure and on the conductive film.

By placing a plurality of such electron-emitting devices on a substrate and by interconnecting the individual electron-emitting devices by wiring, an electron source having a plurality of surface-conduction type electron-emitting devices is manufactured.

By combining the electron source and a phosphor layer, a display panel of an image-forming apparatus is manufactured. Examples of conventional methods for manufacturing such a panel using the electron source will be described below.

In a first example of a manufacturing method, an electron source substrate is fabricated, wherein a plurality of electron-emitting devices formed on a substrate are interconnected by wiring, each device including a conductive film and a pair of device electrodes connected to the conductive film. The entire electron source substrate is placed in a vacuum chamber. After the vacuum chamber is evacuated, a fissure is formed in the conductive film of each device by applying a voltage to each device through an external terminal. A gas containing an organic substance is introduced into the vacuum chamber, and a voltage is applied again through the external terminal to each device in an atmosphere containing the organic substance so that carbon or a carbon compound is deposited in the fissure and on the conductive film.

In a second example of a manufacturing method, an electron source substrate is fabricated, wherein a plurality of electron-emitting devices formed on a substrate are interconnected by wiring, each device including a conductive film and a pair of device electrodes connected to the conductive film. Next, the electron source substrate and another substrate provided with a phosphor layer are joined to each other with a supporting frame therebetween to produce a panel of an image-forming apparatus. Next, the panel is evacuated through a gas outlet of the panel, and a voltage is applied to each device through an external terminal of the panel to form a fissure in the conductive film of each device. A gas containing an organic substance is then introduced into the panel space via the gas outlet of the panel and a voltage is applied again through the external terminal to each device in an atmosphere containing the organic substance so that carbon or a carbon compound is deposited in the fissure and on the conductive film.

SUMMARY OF THE INVENTION

In the first manufacturing method described above, as the size of the electron source substrate increases, a larger vacuum chamber and a high vacuum exhauster are required. In the second manufacturing method, it takes a long time to evacuate the panel space and to introduce the gas containing the organic substance into the panel space.

It is an object of the present invention to provide an apparatus for manufacturing an electron source including a voltage-applying probe, in which the probe has improved electrical connectivity and durability, and wherein a reduction in size and facilitation of operations are enabled. It is another object of the present invention to provide a method for manufacturing an electron source, in which cost, and the amount of work and time for manufacturing can be saved, and manufacturing rate improved, thus enabling the method to be suitable for use in mass production of electron sources. It is another object of the present invention to provide an apparatus for manufacturing an electron source having superior electron-emitting characteristics relative to at least some other electron sources. It is a further object of the present invention to provide a method for manufacturing an electron source using the apparatus.

In one aspect of the present invention, a probe is provided for applying a voltage to electrically conductive lines formed on a substrate, the lines being connected to conductors provided on the substrate, the probe includes a conductive sheet, and the conductive sheet includes a mesh sheet in which linear members are woven into a mesh and a conductive material is applied to (coupled to or deposited on) the mesh sheet. An elastic member presses the conductive sheet against the lines, and a holding member holds the conductive sheet and the elastic member together.

Preferably, the holding member includes a block and support plates. Preferably, in the conductive sheet, at least one surface of the mesh sheet is coated with the conductive material. Preferably, the support plates do not cover lower parts of sides of the block, and the elastic member is held separately from the block so as to be independently movable. In accordance with one embodiment of the invention, the conductive material may be applied to (deposited on) the mesh sheet in a striped pattern. Also, the linear members may be woven obliquely with respect to a longitudinal direction in which the electrically conductive lines (wirings) formed on the substrate extend. Preferably, the linear members and the longitudinal direction in which the electrically conductive lines formed on the substrate extend are offset from each other by an angle that is in the range of 10° to 80°. Also, in a preferred embodiment of the invention, surfaces of the mesh sheet are smoothed, the pitch of the individual linear members is smaller than the width of an individual line (wiring), and, more preferably, the pitch of the individual linear members is 300 $\mu$m or less.

In another aspect of the present invention, an apparatus for manufacturing an electron source includes a base for supporting a substrate provided with conductors, a gas inlet, a gas outlet, a container for covering a surface of the substrate partially, and a unit for introducing a gas into the container, the unit being connected to the gas inlet. The apparatus also includes a unit for discharging a gas from the container, the unit being connected to the gas outlet, and a unit for applying a voltage to the conductors.

The apparatus of the present embodiment of the invention may include a voltage-applying probe as the unit for applying a voltage to the conductors, the probe including a conductive sheet in contact with at least one electrically conductive line formed on the substrate, and the conductive sheet including a mesh sheet in which linear members are woven into a mesh and a conductive material applied to (coupled to, or deposited on) the mesh sheet. An elastic member of the apparatus presses the conductive sheet against the line, and a block and support plates of the apparatus hold the conductive sheet and the elastic member together, in place. The voltage-applying probe is used for performing an electrical process and for performing testing to detect a disconnection, short-circuit, and resistance of the lines and conductors.

In the apparatus for manufacturing the electron source, preferably, in the conductive sheet, at least one surface of the mesh sheet is coated with the conductive material. Preferably, the support plates do not cover lower parts of sides of the block, and the elastic member is formed separately from the block so as to be independently movable. In accordance with one embodiment of the invention, the conductive material may be applied to the mesh sheet in a striped pattern, and the linear members may be woven obliquely with respect to the longitudinal direction of the electrically conductive lines (wirings) formed on the substrate. Preferably, an angle offsetting the linear members and the longitudinal direction of the lines formed on the substrate is in the range of 10° to 80°. Also, in a preferred embodiment of the invention, surfaces of the mesh sheet are smoothed, and a pitch of the individual linear members is smaller than the width of the individual lines. More preferably, the pitch of the linear members is 300 $\mu$m or less.

As described above, in accordance with the present invention, an apparatus for manufacturing and electron source includes a base for supporting a substrate preliminarily provided with conductors and a container for covering the substrate supported by the base. The container covers the surface of the substrate partially, and thus it is possible to form an airtight space on the substrate with the electrically conductive lines (wirings) connected to the conductors formed on the substrate being partially exposed to the environment outside of the container. The container also is provided with a gas inlet and a gas outlet. The inlet and outlet are connected to a unit for introducing a gas into the container and a unit for discharging a gas from the container, respectively. By virtue of these features, the atmosphere inside the container can be controlled to achieve desired conditions. The substrate preliminarily provided with the conductors is a substrate in which electron-emitting sections are formed in the conductors by a predetermined electrical process to produce an electron source. Therefore, the manufacturing apparatus of the present invention further includes a unit for performing the electrical process, for example, a unit for applying a voltage to the conductors. In such a manufacturing apparatus, a reduction in manufacturing apparatus size is achieved. Moreover, operations, such as making an electrical connection to a power source during the electrical process, can be facilitated by the voltage-applying probe as described above, and further there is freedom provided with regard to the design for the size and shape of the container so that introduction of the gas into the container and discharge of the gas from the container can be performed quickly.

In another aspect of the present invention, in a method for manufacturing an electron source, a substrate on which conductors and electrically conductive lines (wirings) connected to the conductors are preliminarily formed is placed on a base, and the conductors on the substrate are covered by a container, although parts of the lines preferably are not so covered. Thus, the conductors are placed in an airtight space formed with the substrate and the container, and the lines formed on the substrate are partially exposed to the environment outside of the container. Next, the atmosphere in the container is controlled to achieve desired conditions, and a predetermined electrical process is performed on the conductors via the parts of the lines exposed to the outside of the container; for example, a voltage is applied to the conductors. The desired atmosphere is, for example, a reduced-pressure atmosphere or an atmosphere in which a predetermined gas is present. The electrical process is a process in which electron-emitting portions are formed in the conductors to produce an electron source (electron-emitting device). The electrical process may be performed a plurality of times in different atmospheres. For example, after the conductors on the substrate are covered by the container, excluding covering parts of the lines, the electrical process is performed in a first atmosphere, and then the electrical process is performed again in a second atmosphere. Desired electron-emitting portions are thereby formed in the conductors and an electron source is produced. Preferably, the first atmosphere is a reduced-pressure atmosphere, and the second atmosphere is an atmosphere in which a gas composed of a carbon compound or the like is present. In the present manufacturing method, electrical connection to a power source, etc., in the electrical process may be facilitated by the use of the voltage-applying probe described above. Since, as described above, there is freedom with regard to the design for the size and shape of the container, etc., introduction of a gas into the container and discharge of a gas from the container can be performed quickly, thereby improving the manufacturing rate as well as improving consistency in the electron emission characteristics of the electron sources manufactured. In particular, uniformity is provided in the electron-emitting characteristics of a manufactured electron source having a plurality of electron-emitting portions. Consequently, in accordance with an aspect of the present invention, it is possible to provide an image-forming apparatus capable of producing images having superior quality relative to those produced by prior art apparatuses.

Further objects, features and advantages of the present invention will become apparent from the following description of the preferred embodiments with reference to the attached drawings.

DESCRIPTION OF THE PREFERRED EMBODIMENTS

Figure 1:
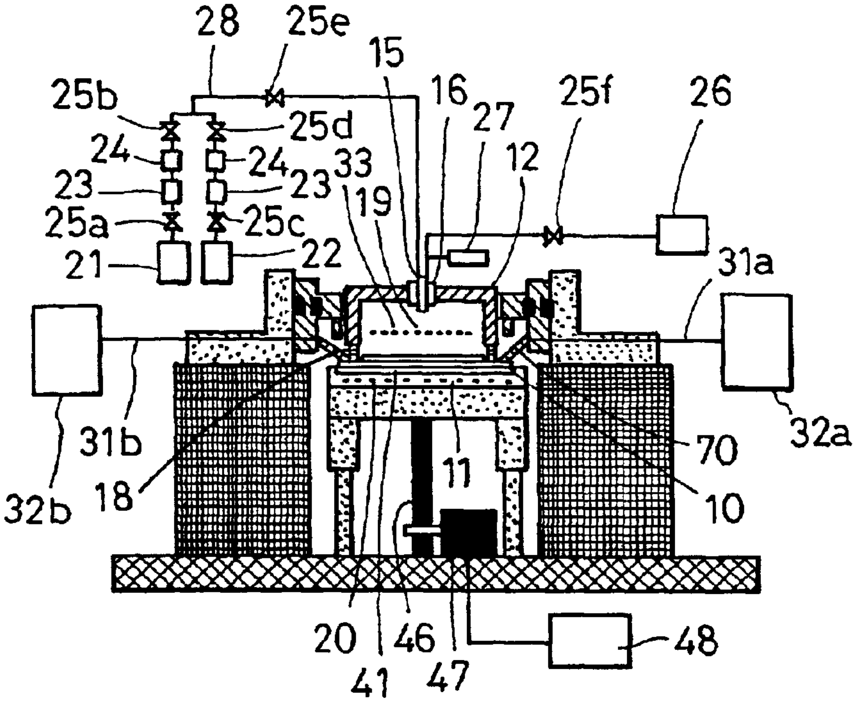
FIG. 1 is a cross-sectional view showing the structure of an apparatus for manufacturing an electron source and connection pipes, etc., in accordance with the present invention.
Figure 2:
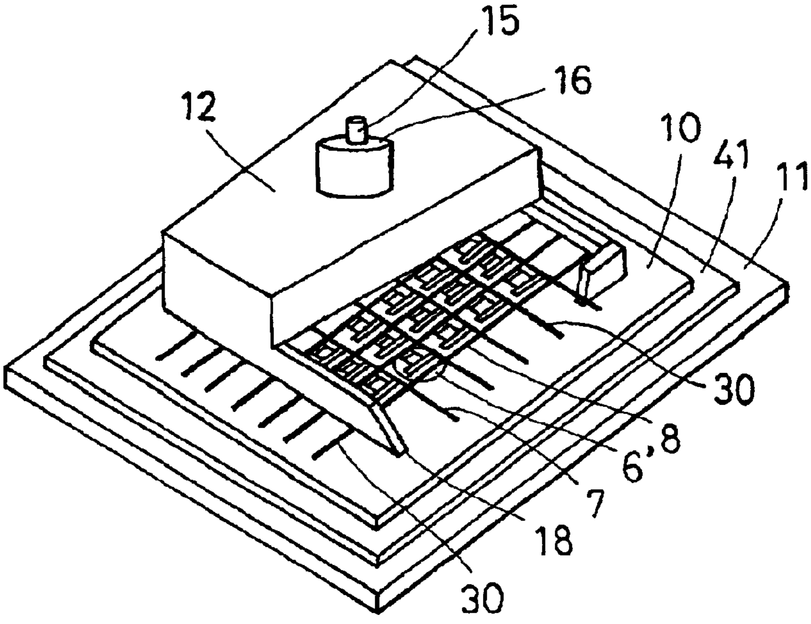
FIG. 2 is a partially cutaway, perspective view which shows the periphery of an electron source substrate shown in FIG. 1 or 3.
Figure 3:
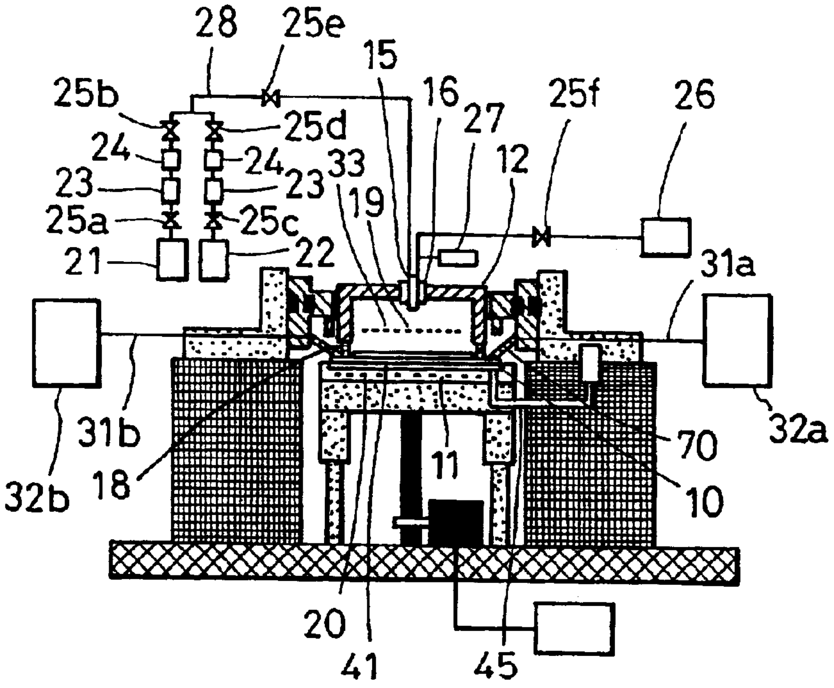
FIG. 3 is a cross-sectional view showing the structure of another apparatus for manufacturing an electron source and connection of pipes, etc., in accordance with the present invention.

FIG. 1 is a cross-sectional view showing the structure of an apparatus for manufacturing an electron source and the connection of pipes, etc., in accordance with an embodiment of the present invention. FIG. 2 is a perspective view which shows the periphery of an electron source substrate shown in FIG. 1 or 3. FIG. 3 is a cross-sectional view showing the structure of an apparatus according to another embodiment of the invention, for manufacturing an electron source and the connection of pipes, etc. In FIG. 2, numeral 6' represents a conductor for forming an electron-emitting device, numeral 7 represents an X-direction line (wiring), numeral 8 represents a Y-direction line (wiring), numeral 10 represents an electron source substrate, numeral 11 represents a base for supporting the substrate 10 at a predetermined position, numeral 12 represents a vacuum container, numeral 15 represents a gas inlet, numeral 16 represents a gas outlet, and, referring also to FIGS. 1 and 3, numeral 18 (FIGS. 1 and 3) represents a sealing member, numeral 19 represents a diffusion panel, numeral 20 represents a heater, numeral 21 represents hydrogen or an organic substance gas in a container, numeral 22 represents a carrier gas in a container, numeral 23 represents a water-removing filter, numeral 24 represents a gas flow control device, numerals 25*a* to 25*f* represent valves, numeral 26 represents a vacuum pump, and numeral 27 represents a vacuum gauge. Also, numeral 28 represents a pipe, numeral 30 (FIG. 2) represents a lead, numerals 32*a* and 32*b* represent drivers including a power source and a current control system, numerals 31*a* and 31*b* represent lines connecting between the lead 30 of the electron source substrate 10 and the drivers 32*a* and 32*b*, respectively, numeral 33 (FIGS. 1 and 3) represents an opening of the diffusion panel 19, numeral 41 represents a heat-conduction member, numeral 46 (FIGS. 1 and 3) represents a lifting shaft, numeral 47 (FIGS. 1 and 3) represents a driving unit for lifting the base 11, and numeral 48 represents a controller for controlling the lift of the base 11. The leads 30 correspond to parts of the lines 7 and 8 which lie outside of the area covered by the container 12 on the substrate 10 when the container 12 is placed so as to cover a part of the substrate 10.

The base 11 preferably supports the electron source substrate 10 at a predetermined position, and has a mechanism for mechanically fixing the electron source substrate 10 in place by a vacuum chuck, an electrostatic chuck, or a jig (not shown). A heater 20 is provided in the base 11, and the electron source substrate 10 may be heated through the heat-conduction member 41 as necessary.

The heat-conduction member 41 which is placed on the base 11 may be sandwiched between the base 11 and the electron source substrate 10 so as not to block the mechanism for fixing the electron source substrate 10, or, in other embodiment, may be embedded in the base 11.

The heat-conduction member 41 absorbs the warpage and swell of the electron source substrate 10, and heat generated in an electrical process (described below) performed on the electron source substrate 10 is reliably and efficiently conducted to the base 11 and dissipated by the heat-conduction member 41. Thereby, it is possible to prevent cracks and damages from occurring in the electron source substrate 10, resulting in an improvement in production yield.

Since the heat generated in the electrical process is quickly and reliably dissipated, concentration distribution of introduced gas due to the temperature distribution can be decreased, and nonuniformity of the electron emission properties of the devices due to the heat distribution in the substrate 10 can be reduced, and, as a result, an electron source having superior uniformity relative to at least some prior art electron sources, can be manufactured.

The heat-conduction member 41 may be composed of a viscous liquid substance, such as silicone grease, silicone oil, or a gel substance. In order to prevent the heat-conduction member 41 composed of the viscous liquid substance from moving on the base, a retention mechanism (not shown) may be provided on the base 11 so that the viscous liquid substance is retained in a predetermined position and in a predetermined region, i.e., at least in the region for forming the conductors 6' of the electron source substrate 10. For example, the viscous liquid substance may be placed in an O-ring or heat-resistant bag, thus constituting a sealed heat-conduction member.

When the viscous liquid substance is retained in an O-ring or the like, if a desired connection or contact is not properly made due to an air layer formed between the substrate 10 and the heat-conduction member 41, a method may be employed in which after an air vent (not shown) and the electron source substrate 10 are set, the viscous liquid substance is poured into a space between the substrate 10 and the base 11. FIG. 3 is a cross-sectional view showing an apparatus in which an O-ring (not shown) and an induction pipe 45 connecting to an inlet in the O-ring for the viscous liquid substance are provided so that the viscous liquid substance is retained in the predetermined region.

If the viscous liquid substance is sandwiched between the base 11 and the electron source substrate 10 and a mechanism for circulating the substance while controlling temperature is provided, the viscous liquid substance may act, instead of the heater 20, as a heating unit or a cooling unit for the electron source substrate 10. Additionally, for example, a mechanism (not shown) including a circulation-type temperature controller and a liquid medium in which the temperature can be adjusted to a predetermined level may be provided on the apparatus.

The heat-conduction member 41 may be composed of, for example, an elastic material or some other suitable material. Examples of the elastic material which may be used in the present invention include synthetic resins, such as Teflon, rubber, such as a silicone rubber, ceramics, such as alumina, and metals, such as copper and aluminum. The elastic material may be formed into a sheet or divided sheets. Alternatively, the form of the elastic material may be cylindrical, columnar, such as being prismatic, linear so as to extend in the X direction or the Y direction corresponding to the lines of the electron source substrate 10, protrudent, such as being conical, or globular, such as being spherical or oval (like a rugby ball). Alternatively, the elastic material may be formed into globes on which protrusions are formed on the surfaces thereof.

The vacuum container 12 preferably is composed of glass or stainless steel, and preferably is composed of a material which does not release a substantial amount of gas from the container. The vacuum container 12 is aligned with the electron source substrate 10 and preferably covers the region of the electron source substrate 10 in which conductors 6' are formed, but not the leads 30. The vacuum container 12 has a structure which enables it to endure a pressure range of $1.33\times10^{-1}$ Pa ($1\times10^{-3}$ Torr) to the atmospheric pressure.

The sealing member 18 maintains the airtightness between the electron source substrate 10 and the vacuum container 12, and is composed of an O-ring, a rubber sheet, or the like.

As the organic substance gas 21, a gas of the organic substance used for "activating" the electron-emitting devices or a gas mixture in which the organic substance is diluted with nitrogen, helium, argon, or the like preferably is used. When an electrical process for "forming" is performed, a gas for accelerating the formation of gaps in the respective conductive films 6' which are disposed between the device electrodes respectively, for example, a hydrogen gas, which is a reducing gas, may be introduced into the vacuum container 12. When a gas is introduced in the other process as described above, it is possible to connect the vacuum container 12 to the pipe 28 using the valve 25*e*.

Examples of the organic substances used for activating the electron-emitting devices include aliphatic hydrocarbons, such as alkanes, alkenes, and alkynes, aromatic hydrocarbons, alcohols, aldehydes, ketones, amines, nitrites, phenols, and organic acids, such as carboxylic acids and sulfonic acids. More specific examples include saturated hydrocarbons represented by $C_nH_{2n+2}$, such as methane, ethane, and propane, unsaturated hydrocarbons represented by $C_nH_{2n}$, such as ethylene and propylene, benzene, toluene, methanol, ethanol, acetaldehyde, acetone, methyl ethyl ketone, methylamine, ethyl amine, phenol, benzonitrile, and acetonitrile.

With respect to the organic substance gas 21, if the organic substance is gaseous at ambient temperatures, it can be used as it is, whereas if the organic substance is liquid or solid at ambient temperatures, it is vaporized or sublimated in a container, and, optionally, may then be mixed with a diluent gas for use. As the carrier gas 22, an inert gas, such as nitrogen, argon, or helium, preferably is used.

The organic substance gas 21 and the carrier gas 22 are mixed at a predetermined ratio and introduced into the vacuum container 12. The flows of both gases and the mixing ratio are controlled by the individual gas flow control devices 24. Each gas flow control device 24 includes a massflow controller, an electromagnetic valve, etc. (not shown). Such a mixed gas is heated to an appropriate temperature by a heater (not shown in the drawing) provided in the periphery of the pipe 28 as necessary, and is then introduced into the container 12 through the gas inlet 15. Preferably, the heating temperature of the mixed gas is the same as the temperature of the electron source substrate 10.

Preferably, the water-removing filter 23 is provided in the middle of the pipe 28 to remove water in the introduced gas. As the water-removing filter 23, an absorbent, such as silica gel, a molecular sieve, or magnesium hydroxide, may be used.

The mixed gas introduced into the container 12 is exhausted through the gas outlet 16 by the vacuum pump 26 at a predetermined exhaust rate, and the pressure of the mixed gas in the container 12 is maintained at a predetermined level. For the vacuum pump 26, an oil-free pump for low vacuum use, such as a dry pump, a diaphragm pump, or a scroll pump, preferably is used.

Although it depends on the type of the organic substance used for activation, in this embodiment of the present invention, preferably, the pressure of the mixed gas is larger than the pressure which makes a mean free path λ of the gas molecules constituting the mixed gas sufficiently smaller than the inner size of the container 12 in view of reduction in the time for the activation process and improvement in uniformity. This pressure range is a so-called "viscous flow" range and corresponds to several hundred pascals (several torrs) to the atmospheric pressure.

Preferably, the diffusion panel 19 is placed between the gas inlet 15 and the electron source substrate 10. Consequently, since the flow of the mixed gas is controlled and the organic substance is supplied to the entire surface of the substrate uniformly, uniformity of the electron-emitting devices is improved.

The leads (lines) 30 of the electron source substrate 10 lie outside the container 12 and are connected to the drivers 32*a* and 32*b* using a probe unit 70 (also identified by reference numeral 101 below).

In the present invention, since the container 12 covers only the conductors 6 on the electron source substrate 10 and the ends of the lines 30 are placed outside the container 12 (exposed to the air), the size of the apparatus can be reduced relative to the sizes of at least some prior art devices. Since parts of the lines (the ends of the lines) 30 of the electron source substrate 10 can be placed outside the container 12, electrical connection between the electron source substrate 10 and the power source (drivers 32*a* and 32*b*) for performing an electrical process is facilitated.

By applying a pulsed voltage to the individual electron-emitting devices on the substrate 10 through the lines 31*a* and 31*b* using the drivers 32*a* and 32*b* while the mixed gas containing the organic substance is passed through the container 12, the activation process of the electron-emitting devices 6 can be performed.

Figure 4:
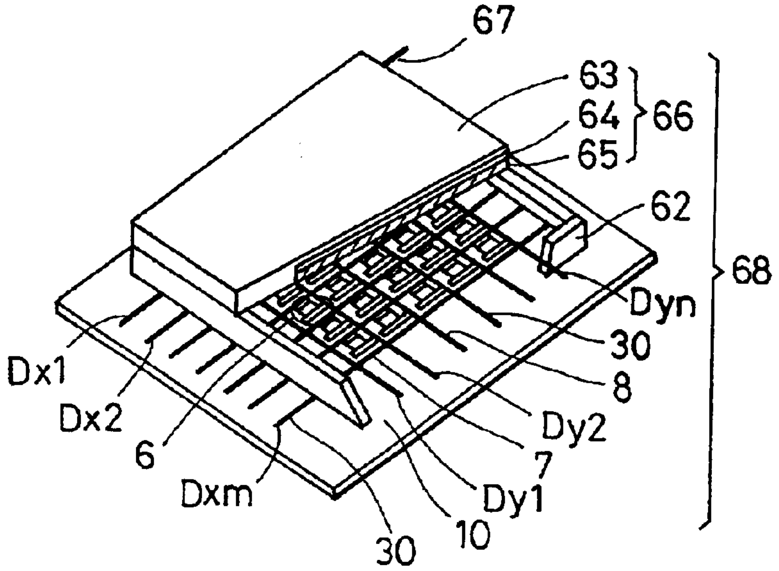
FIG. 4 is a perspective view of an image-forming apparatus, with an upper portion of the apparatus partially removed.

A method for manufacturing an electron source using the apparatus described above will now be described below in detail. By combining the electron source and image-forming members, an image-forming apparatus as shown in FIG. 4 can be fabricated. In FIG. 4, numeral 6 represents an electron-emitting device, numeral 62 represents a supporting frame, numeral 66 represents a face plate including a glass substrate 63, a phosphor layer 64, and a metal back 65, and numeral 68 represents the image-forming apparatus. The electron-emitting device 6 is formed by performing the "forming" step and the "activation" step to conductor 6'.

In the image-forming apparatus 68, scanning signals and modulating signals are applied to the individual electron-emitting devices 6 through external terminals $D_{x1}$ to $D_{xm}$ and external terminals $D_{y1}$ to $D_{yn}$, respectively, by signal-generating units (not shown in the drawing) so that electrons are emitted by the electron-emitting devices. By applying a high voltage of 5 kV to the metal back 65 or a transparent electrode disposed between the glass substrate 63 and the phosphor layer 64 (not shown in the drawing) through a high-voltage terminal 67, an electron beam is accelerated and forced to collide with the phosphor layer 64, and thereby excitation and luminescence are caused at the layer 64 so that an image is displayed.

Scanning signal lines may be placed on one side, as shown in FIG. 4, as long as the number of devices is small and a voltage drop does not affect the electron source, for example, between the electron-emitting device close to the external terminal $D_{x1}$ and the electron-emitting device far from the external terminal $D_{x1}$. When the number of devices is large and a considerable voltage drop occurs, the line width may be increased, the line thickness may be increased, or voltages may be applied from both sides.

The present invention particularly relates to the probe section in the embodiment described above. More particularly, the present invention improves the electrical connection of the probe to the lines formed on the substrate 10 and the durability of the probe. Furthermore, the present invention saves cost, work, and time associated with fabricating a structure in which one probe is used per line. The apparatus for manufacturing an electron source in this embodiment of the present invention includes a probe for applying a voltage to lines connected to conductors provided on a substrate. The probe preferably includes a conductive sheet, the conductive sheet including a mesh sheet in which linear members are woven into a mesh and a conductive material is deposited on the mesh sheet. An elastic member presses the conductive sheet against the lines, and a holding member holds the conductive sheet and the elastic member together, the holding member including a block and support plates.

The present aspect of this invention will now be described in detail with reference to the following examples.

EXAMPLE 1

In this example, an electron source provided with a plurality of surface-conduction electron-emitting devices was manufactured using a manufacturing apparatus in accordance with the present invention.

Figure 7:
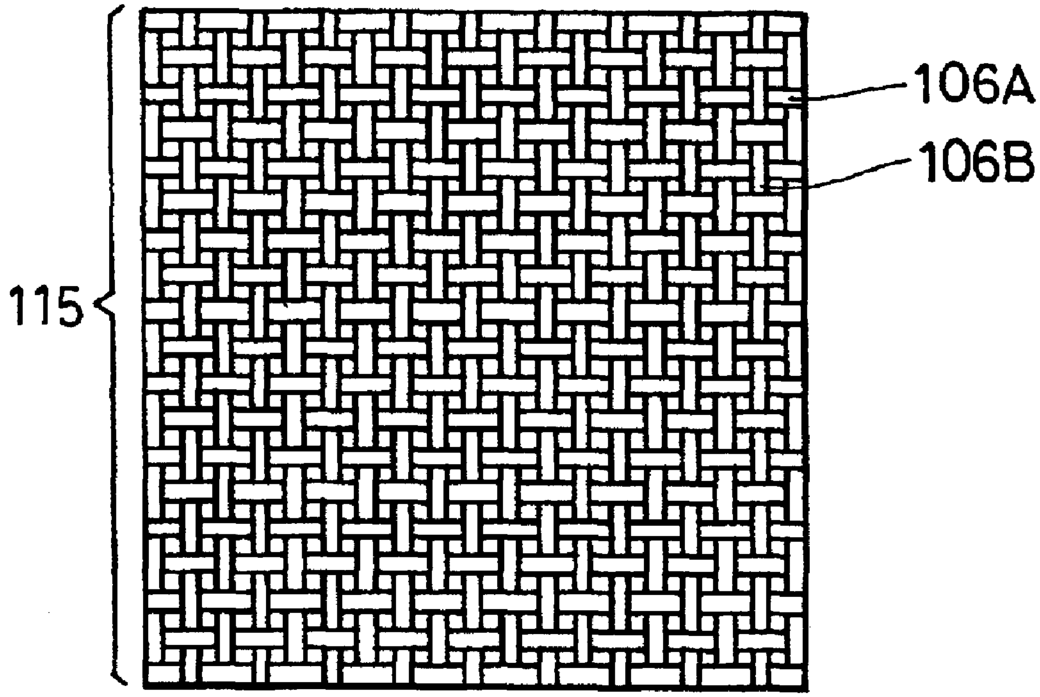
FIG. 7 is a schematic diagram showing a sheet in which linear members are woven into a mesh in accordance with the present invention.
Figure 8:
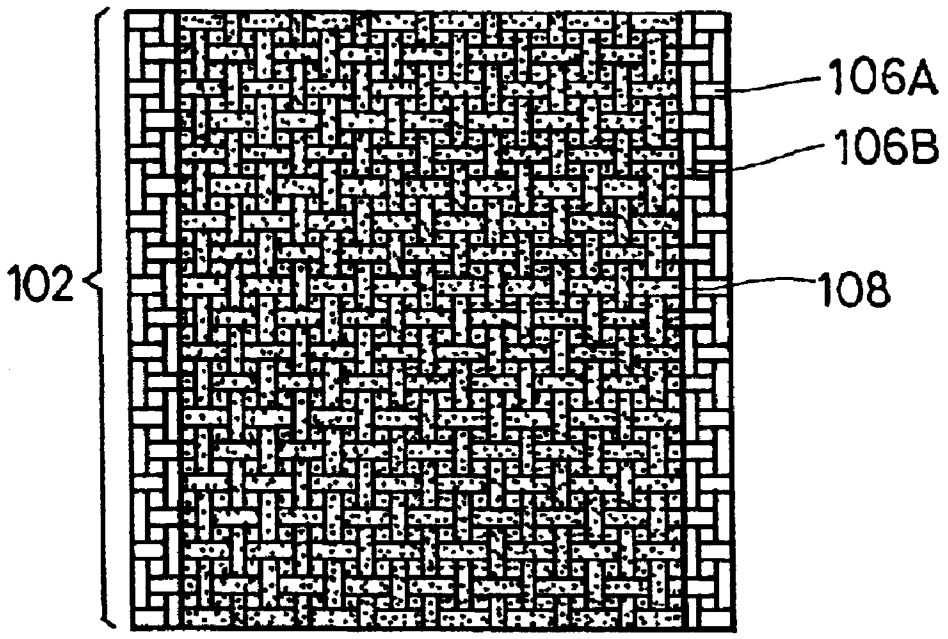
FIG. 8 is a schematic diagram showing a conductive sheet in accordance with the present invention.
Figure 9:
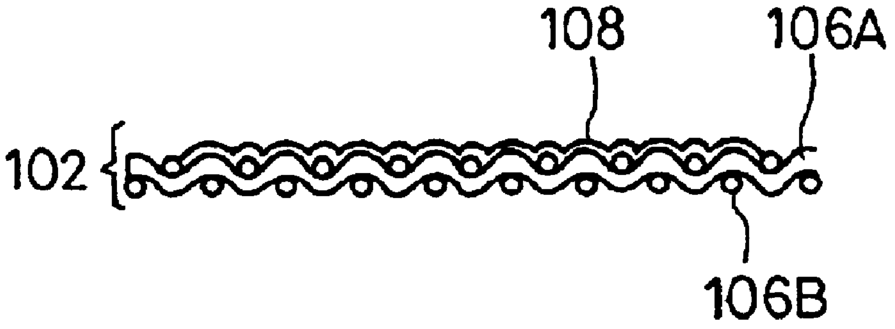
FIG. 9 is a cross-sectional view of a conductive sheet in accordance with the present invention.
Figure 10:
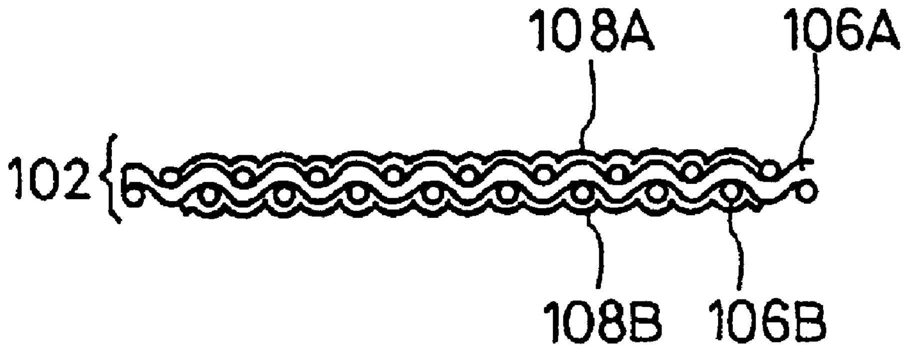
FIG. 10 is a cross-sectional view of another conductive sheet in accordance with the present invention.

In a mesh sheet 115 shown in FIG. 7, a plurality of linear members 106A and 106B composed of a resin were woven into a mesh. The linear members 106A and 106B may be composed of, for example, a metal. In FIG. 8, as a conductive sheet 102, a mesh circuit connector (MCC), such as that manufactured by NBC Inc., was used, in which a conductive material layer 108 composed of copper or the like was formed (deposited) on the mesh sheet 115 (FIG. 7). The conductive material layer 108 may be composed of aluminum or gold. Alternatively, the conductive material layer 108 may have a multi-layered structure formed of copper-nickel-gold. In order to form the conductive material layer 108, plating was used. FIG. 9 is a cross-sectional view of the conductive sheet 102 in which the conductive material layer 108 was formed on one surface of sheet 115. FIG. 10 is a cross-sectional view of a conductive sheet 102 in which the conductive material layers 108A and 108B were formed on two surfaces of sheet 115, respectively.

Figure 5:
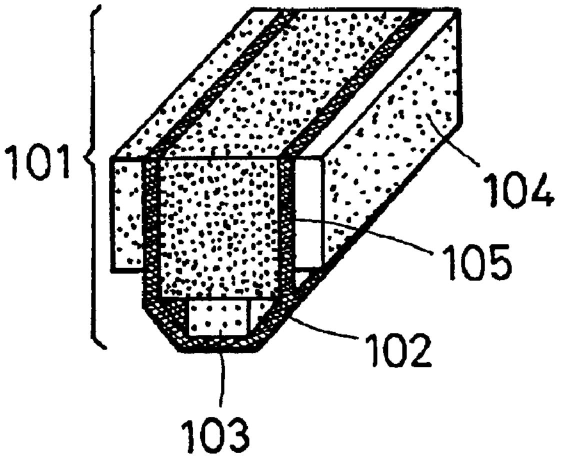
FIG. 5 is a perspective view of a probe in accordance with the present invention.

FIG. 5 is a perspective view of a probe 101 constructed in accordance with an exemplary embodiment of this invention. The probe 101 includes a conductive sheet 102, an elastic member 103 composed of silicone rubber for pressing the conductive sheet against the lines (not shown in FIG. 5) of an electron source substrate, such as substrate 10 (FIGS. 1 to 4), and a block 105 and support plates 104 for holding the conductive sheet 102 and the elastic member 103 together.

Figure 6:
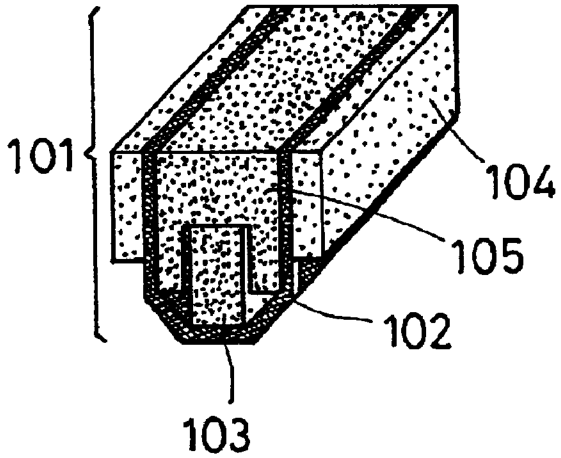
FIG. 6 is a perspective view of another probe in accordance with the present invention.

Alternatively, the probe 101 may have a structure as shown in FIG. 6. The elastic member 103 may be a leaf spring or a coil spring. The probe 101 having such a structure was pressed against the plurality of lines 7 and 8 formed on the substrate 10 shown in FIG. 2, and a voltage was applied through the drivers 32*a* and 32*b* shown in FIG. 1 or 3, and thereby, disconnection, short-circuiting, and the resistance of the lines 7 and 8 and the conductors 6' were tested, and also, electrical power was supplied to the conductors.

Using the apparatus for manufacturing an electron source in accordance with the present invention, it was possible to manufacture an electron source including the electron source substrate 10 and to perform an activation process of the electron-emitting devices thereof to cause them to yield superior electron-emitting characteristics.

Furthermore, even if there was a difference in height among the lines 7 and 8, the probe was brought into contact with the lines 7 and 8 flexibly so as to supply electrical power with satisfactory electrical connectivity and stability, and thus it was possible to produce uniform and stable electron-emitting devices.

Furthermore, since one probe was used for a plurality of lines, it was possible to significantly reduce costs, the amount of work, and time required for the fabrication.

EXAMPLE 2

Figure 11:
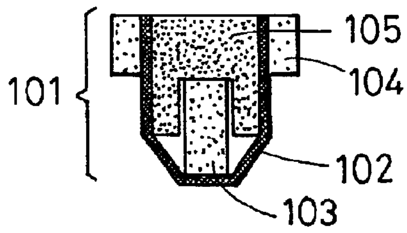
FIG. 11 is a cross-sectional view of a probe in accordance with the present invention.
Figure 12:
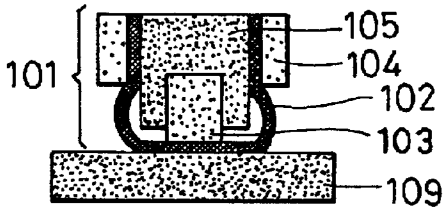
FIG. 12 is a cross-sectional view of a probe used in Example 2 of the present invention.

In this example, a probe 101 was used which had substantially the same structure as that of the probe used in Example 1, apart from the fact that the lower parts of the sides of the block 105 were not covered by the support plates 104, as shown in FIG. 11. FIG. 12 is a cross-sectional view showing a state in which the probe 101 was pressed against the lines (not shown in FIG. 12) on a substrate 109. As shown in FIG. 12, the conductive sheet 102 became deformed so as to protrude at an area below the sides of the block 105. Due to such a deformation, the probe 101 was pressed against the lines on the substrate 109 without bending at the area of the conductive sheet 102 in contact with the lines, and without a locally applied load. Even if the probe 101 was used repeatedly, the conductive material layer 108 (FIG. 8) formed on the conductive sheet 102 was not disconnected or detached, and thereby durability was improved. In this example, the same advantages as those of Example 1 were also obtained.

COMPARATIVE EXAMPLE

Figure 13:
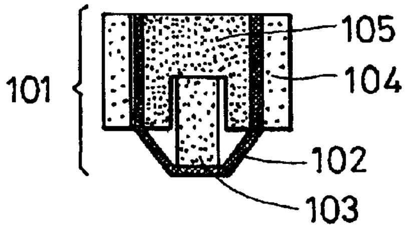
FIG. 13 is a cross-sectional view of a probe used in a Comparative Example of the present invention.
Figure 14:
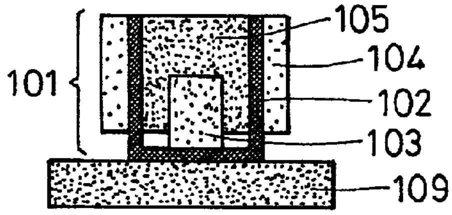
FIG. 14 is a cross-sectional view of the probe pressed against lines in the Comparative Example.

A comparative example to Example 2 is shown in FIGS. 13 and 14. FIG. 13 is a cross-sectional view showing a probe

101 with a structure in which lower parts of sides of the block 105 were covered by support plates 104. When the probe 101 was pressed against lines on the substrate 109 (not shown in FIG. 13), the conductive sheet 102 was bent as shown in FIG. 14. By repeating this, the probe 101 became unable to perform electrical connection because the conductive material layers (108) became disconnected or detached at the bent sections of the conductive sheet 102. It was also not possible to test disconnection, short-circuiting, and the resistance of the lines and the conductors or to supply electrical power to the conductors.

EXAMPLE 3

Figure 15:
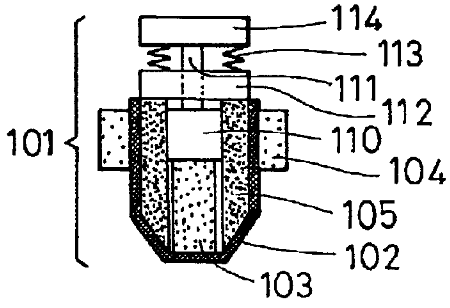
FIG. 15 is a cross-sectional view of a probe in accordance with the present invention.

In a probe 101 shown in FIG. 15, an elastic member 103 was fixed to a support plate 114 by an elastic fixing plate 110 and an elastic bar 111, and a conductive sheet 102 was fixed on blocks 105 at the sections supported by support plates 104. The blocks 105 were fixed on a block holding plate 112. By connecting the block holding plate 112 to the support plate 114 via a spring 113, the elastic member 103 was supported separately from the blocks 105 for supporting the conductive sheet 102 so as to be independently movable. In another embodiment, an elastic material, such as rubber, may be used instead of the spring 113.

When the probe 101 having the structure described above was pressed against at least one line formed on a substrate (not shown in FIG. 15), although the elastic member 103 shrank, since the conductive sheet 102 was not deformed, the probe 101 was pressed against the line without bending of the conductive sheet 102 in the area pressed against line and without a locally applied load. Even if the probe 101 was used repeatedly, the conductive material layer (108) formed on the conductive sheet 102 was not disconnected or detached, and thereby durability was improved. In this example, the same advantages as those of Example 1 were also obtained.

EXAMPLE 4

Figure 16:
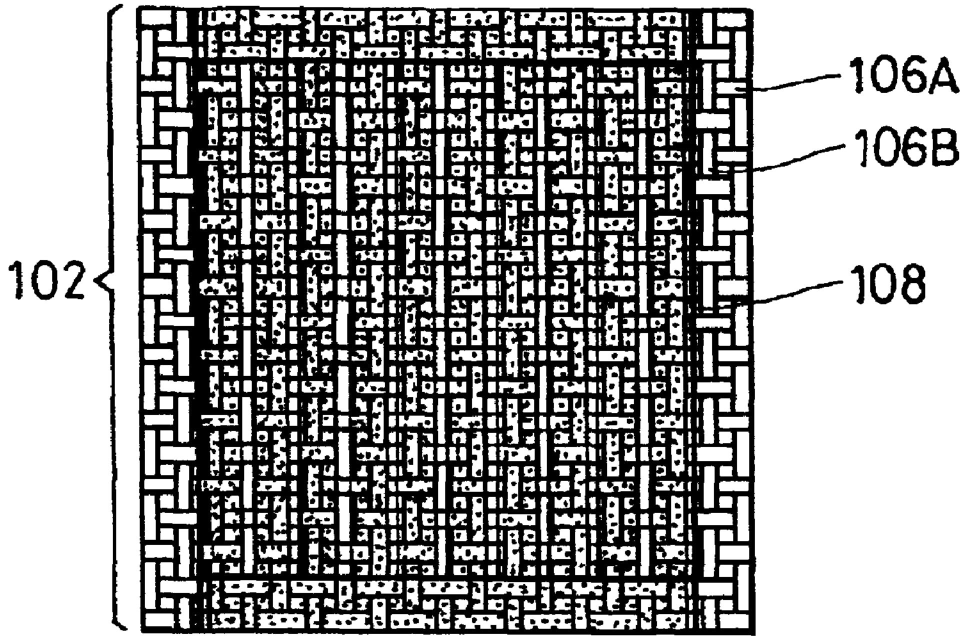
FIG. 16 is a schematic diagram of a conductive sheet in accordance with the present invention.
Figure 17:
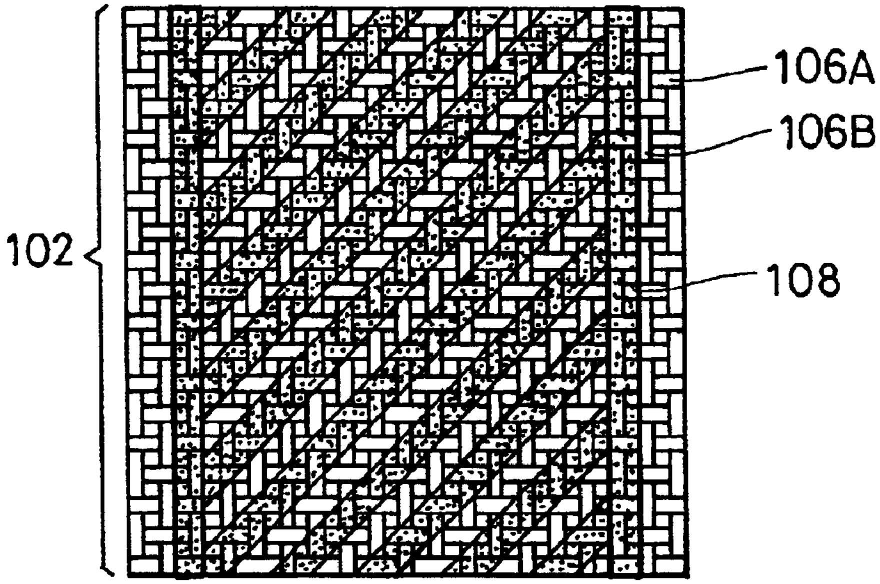
FIG. 17 is a schematic diagram of another conductive sheet in accordance with the present invention.

In this example, a conductive material layer 108 was formed on the mesh sheet 115 shown in FIG. 7 in a striped pattern, and an example of the resulting structure 102 is shown in FIG. 16. By fabricating a probe using the conductive sheet 102 as shown in the drawing, it was possible to press the probe flexibly against lines on a substrate. The conductive material layer 108 may be patterned obliquely as shown in FIG. 17. Additionally, since the conductive sheet 102 is flexible, it was possible to bring the probe into contact with all the lines reliably. In this example, the same advantages as those of Example 1 were also obtained.

EXAMPLE 5

Figure 18:
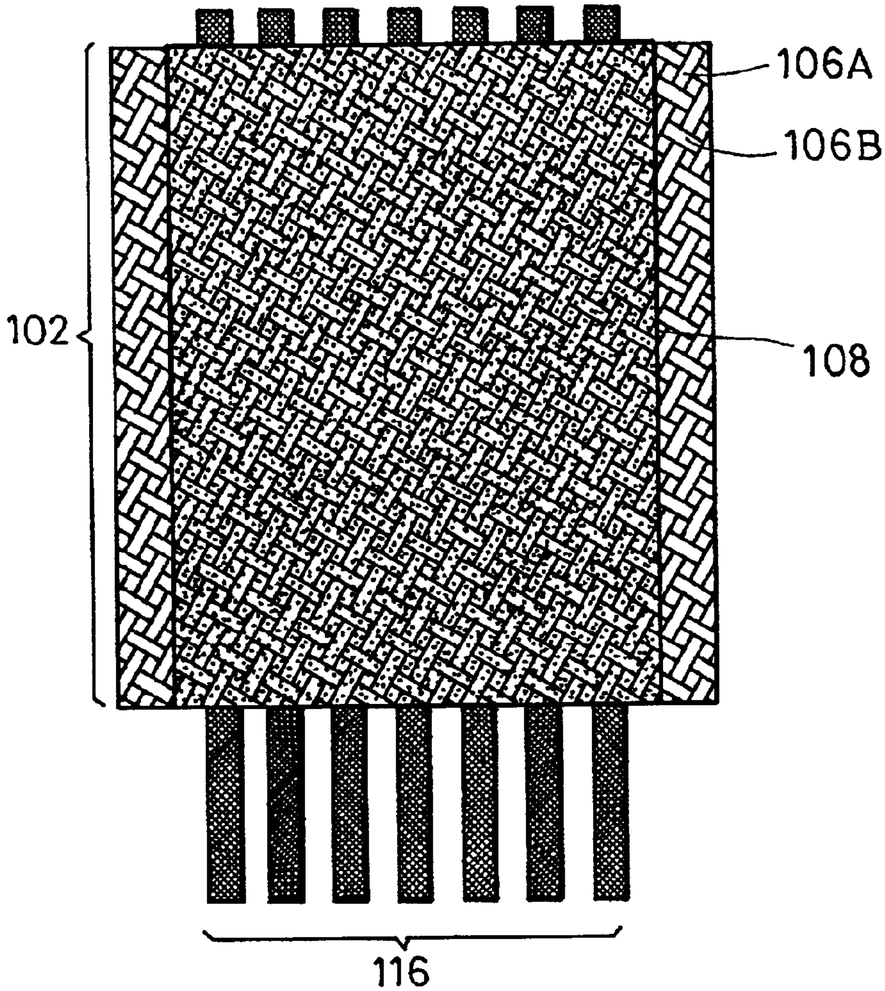
FIG. 18 is a schematic diagram of another conductive sheet in accordance with the present invention.

FIG. 18 is a schematic diagram showing a conductive sheet 102 used in this example. As shown in the drawing, the linear members 106A constituting the conductive sheet 102 were woven at an angle of 22.5° with respect to the lines 116 formed on the substrate (not shown in FIG. 18). A probe was fabricated using the conductive sheet 102, and since a plurality of linear members 106A were brought into contact with one of the lines 116, a reliable connection to the lines 116 was provided. The angle may be changed depending on the number of lines 116, their widths, pitch, etc. In this example, the same advantages as those of Example 1 were also obtained.

EXAMPLE 6

Figure 19:
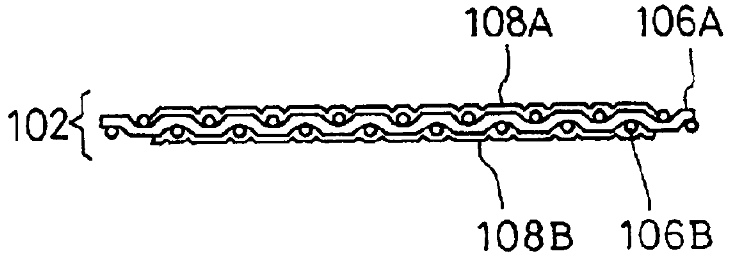
FIG. 19 is a cross-sectional view of another conductive sheet in accordance with the present invention.

FIG. 19 is a cross-sectional view showing a conductive sheet 102 used in this example. In the conductive sheet 102, a mesh sheet in which linear members 106A and 106B were woven was smoothed with a roller while applying heat so that the convex portions of the mesh were smoothed, and conductive layers 108A and 108B were formed on both surfaces thereof. As the smoothing method, according to one embodiment, pressing may be performed. By fabricating a probe using the conductive sheet 102, since contact with the substrate lines (not shown in FIG. 19) was made by planes of the sheet 102 instead of by points of the sheet 102, the contact resistance was decreased and the variation in resistance reduced, and thereby, it was possible to supply electrical power stably and reliably with reduced electrical losses. In this example, the same advantages as those of Example 1 were also obtained.

EXAMPLE 7

In this example (not shown), the pitch of linear members constituting a conductive sheet was set at approximately 70 μm, which was narrower than the width of a substrate line, i.e., approximately 90 μm. By fabricating a probe using the conductive sheet in which the linear members were woven with such a pitch, it was possible to bring the probe into contact with all of the plurality of lines reliably, thereby performing electrical connection stably and reliably, with reduced electrical losses. In this example, the same advantages as those of Example 1 were also obtained.

While the present invention has been described with reference to what are presently considered to be the preferred embodiments, it is to be understood that the invention is not limited to the disclosed embodiments only. To the contrary, the invention is intended to cover various modifications and equivalent arrangements included within the spirit and scope of the appended claims. The scope of the following claims is to be accorded the reasonable broadest interpretation so as to encompass all such modifications and equivalent structures and functions.

What is claimed is:

1. A probe for applying a voltage to electrically conductive lines formed on a substrate, the probe comprising:

a conductive sheet, arranged for making contact with the lines formed on the substrate, the conductive sheet comprising a mesh sheet in which linear members are woven into a mesh and a conductive material which coats the mesh sheet;

an elastic member, arranged for pressing the conductive sheet against the lines; and a holding member, arranged for holding the conductive sheet and the elastic member together.

2. A probe according to claim 1, wherein the holding member comprises a block disposed between opposing inner surfaces of an inner portion of the conductive sheet, and support plates disposed on respective opposite outer surfaces of an outer portion of the conductive sheet.

3. A probe according to claim 1, wherein the conductive material is applied to at least one surface of the mesh sheet.

4. A probe according to claim 2, wherein the support plates do not cover lower parts of sides of the block.

5. A probe according to claim 2, wherein the elastic member is held separately from the block by said holding member, so as to be independently movable.

6. A probe according to claim 1, wherein the conductive material is applied to the mesh sheet in a striped pattern.

7. A probe according to claim 1, wherein the linear members of the mesh sheet are woven obliquely with respect to a longitudinal direction in which the lines formed on the substrate extend.

8. A probe according to claim 7, wherein an angle at which the linear members are offset from the longitudinal direction of corresponding ones of the lines formed on the substrate is in a range of 10° to 80°.

9. A probe according to claim 1, wherein surfaces of the mesh sheet are smoothed.

10. A probe according to claim 1, wherein a pitch of the linear members of the mesh sheet is smaller than a width of individual ones of the lines.

11. A probe according to claim 10, wherein the pitch of the linear members is 300 μm or less.

12. An apparatus for manufacturing an electron source, comprising:

a probe according to claim 1;

a base, arranged for supporting a substrate provided with conductors; and a vacuum container, arranged for covering the substrate provided with conductors partially.

* * * * *